(12) United States Patent
Bolduc

(10) Patent No.: US 9,140,759 B2
(45) Date of Patent: *Sep. 22, 2015

(54) ELECTRIC VEHICLE BATTERY PACK VOLTAGE MONITORING

(71) Applicant: FORD GLOBAL TECHNOLOGIES, LLC, Dearborn, MI (US)

(72) Inventor: Robert J. Bolduc, Allen Park, MI (US)

(73) Assignee: FORD GLOBAL TECHNOLOGIES, LLC, Dearborn, MI (US)

( * ) Notice: Subject to any disclaimer, the term of this patent is extended or adjusted under 35 U.S.C. 154(b) by 129 days.

This patent is subject to a terminal disclaimer.

(21) Appl. No.: 14/077,635

(22) Filed: Nov. 12, 2013

(65) Prior Publication Data

US 2015/0130471 A1    May 14, 2015

(51) Int. Cl.
*G01N 27/416* (2006.01)
*G01R 31/36* (2006.01)

(52) U.S. Cl.
CPC ................... *G01R 31/362* (2013.01)

(58) Field of Classification Search
USPC .................... 324/426, 434; 320/118
See application file for complete search history.

(56) References Cited

U.S. PATENT DOCUMENTS

| | | | | |
|---|---|---|---|---|
| 5,780,980 A * | 7/1998 | Naito | ............................ | 318/139 |
| 7,772,799 B2 | 8/2010 | Wu | | |
| 7,966,110 B2 | 6/2011 | Tarchinski | | |
| 8,018,202 B2 | 9/2011 | Masson et al. | | |
| 8,054,043 B2 * | 11/2011 | Yano | ............................ | 320/118 |
| 8,174,237 B2 | 5/2012 | Kosugi et al. | | |
| 8,283,892 B2 | 10/2012 | Miyazaki et al. | | |
| 8,513,918 B2 * | 8/2013 | Ueda et al. | .................... | 320/116 |
| 2007/0221627 A1 * | 9/2007 | Yugou et al. | .................. | 218/136 |
| 2011/0049977 A1 * | 3/2011 | Onnerud et al. | ............... | 307/9.1 |
| 2011/0101920 A1 | 5/2011 | Seo et al. | | |
| 2012/0161677 A1 | 6/2012 | Kunimitsu et al. | | |
| 2013/0069598 A1 | 3/2013 | Tanaka et al. | | |

OTHER PUBLICATIONS

Analog Devices, Lithium Ion Battery Monitoring System AD7280A, 2011, pp. 1-48.
Linear Technology, LTC6804-1/LTC6804-2, Multicell Battery Monitors.
Intersil, Multi-cell Li-Ion Battery Manager, Dec. 14, 2012.

\* cited by examiner

*Primary Examiner* — Samuel Berhanu
(74) *Attorney, Agent, or Firm* — David Kelley; MacMillan, Sobanski & Todd, LLC

(57) ABSTRACT

Total voltage output by a multi-cell battery pack in an electric vehicle is monitored. A main microcontroller having a chassis ground is digitally isolated from positive and negative busses of the battery pack. A battery monitoring IC having a plurality of auxiliary/thermistor A/D inputs measures respective voltages of the battery cells. A voltage divider is selectably coupled to the positive bus by an evaluation switch under control of the main microprocessor with an auxiliary output terminal of the IC. A divided voltage is coupled to one of the auxiliary/thermistor A/D inputs. The battery monitoring IC transmits a digital value representative of the divided voltage output to the main microprocessor via the serial data link, and the main microprocessor determines the main battery voltage in response to the digital value.

5 Claims, 3 Drawing Sheets

ELECTRIC VEHICLE BATTERY PACK VOLTAGE MONITORING

CROSS REFERENCE TO RELATED APPLICATIONS

Not Applicable.

STATEMENT REGARDING FEDERALLY SPONSORED RESEARCH

Not Applicable.

BACKGROUND OF THE INVENTION

The present invention relates in general to vehicles with electric propulsion, and, more specifically, to monitoring of an output voltage from a battery pack by a microcontroller that is digitally isolated from the high voltage battery circuits.

The DC power source (e.g., a battery) and other elements of electric drives for hybrid or electric vehicles require monitoring in order to maximize efficiency and performance as well as to detect potential malfunctions. Common battery types such as lithium ion (Li-Ion) use a large number of cells stacked together into a battery pack. Besides monitoring the total voltage output by a battery pack, each cell is typically monitored individually to determine their voltage production and other parameters. The temperature of each cell is also monitored in order to protect against overheating.

It is very challenging to reliably monitor the various battery conditions because of the high-voltage levels involved, the range of intermediate voltages at which respective cells operate within the stack, and the high levels of accuracy required. Various battery monitoring integrated circuit devices have been developed commercially for use in the vehicle environment. Examples of a commercially available battery monitoring IC device include the AD7280A device available from Analog Devices, Inc., of Norwood, Mass., the LTC6804 devices available from Linear Technology Corporation of Milpitas, Calif., and the ISL94212 Multi-Cell Li-Ion Battery Manager available from Intersil Corporation of Milpitas, Calif. In addition to a plurality of inputs for directly monitoring respective battery cells, the known IC devices include several analog inputs for measuring the outputs of thermistor circuits used as temperature sensors for the respective battery cells.

Each commercially available battery monitoring IC is designed with a specific number of measurement channels from monitoring respective battery cells. The AD7280A mentioned above has 6 channels, and the LTC6804 and ISL94212 each has 12 channels. In order to achieve the desired output voltage levels, a typical Li-Ion battery for an electric vehicle often stacks as many as about 96 cells. In order to monitor individual cells, the battery monitoring ICs are likewise stacked between the positive and negative output busses of the battery pack. Since no single monitoring IC is connected to both busses, additional components are used in order to measure the full output voltage of the battery pack. Furthermore, additional components are used to measure the full output voltage of the battery pack rather than summing the individual cell voltages (or group of cells) as measured by the IC because of sampling time and microcontroller chronometric loading reasons (e.g., the large number of serial messages that would be required).

The measured parameters of the battery cells, battery pack, and associated devices are all used by a main microcontroller or microprocessor for performing battery management and communication. The main micro is typically located in a discrete battery control module or box that interfaces with other vehicle components such as a vehicle system/powertrain controller or a driver interface module. Consequently, the main micro uses a chassis ground for its voltage reference. The chassis ground is isolated from the main battery pack's reference which is provided at the negative battery bus.

The battery monitoring ICs deployed with the battery pack must monitor the battery cells while being referenced to the negative bus. Therefore, the battery monitoring ICs and any other monitoring devices connected in the high-voltage domain must communicate with the main micro through domain-crossing elements that provide digital isolation between the high-voltage battery domain and the chassis ground domain (i.e., low voltage domain) of the main micro. In order for the main micro to both control the monitoring elements and receive the resulting measured data, relatively expensive components such as photoMOS transistors and a dedicated, high-voltage-referenced analog-to-digital (A/D) converter integrated circuit are typically employed. It would be very desirable to avoid the use of the expensive add-on components while maintaining robust detection of the output voltage from the battery pack.

SUMMARY OF THE INVENTION

In one aspect of the invention, an electric vehicle system is provided having a multi-cell battery pack supplying a main battery voltage between a positive bus and a negative bus. A main microcontroller monitors performance of the battery pack. The main microcontroller is coupled to a chassis ground and is digitally isolated from the positive and negative busses. A battery monitoring IC is connected to the battery pack to measure respective voltages of cells in the battery pack, wherein the battery monitoring IC has an isolated serial data link to the main microcontroller to report the measured voltages. The battery monitoring IC further includes a plurality of auxiliary/thermistor A/D inputs and an auxiliary output terminal selectably providing a drive signal. An evaluation switch has an input, an output, and a control terminal, wherein the input is connected to the positive bus. The control terminal is coupled to the auxiliary output terminal so that the evaluation switch is activated in response to a command received from the main microprocessor over the serial data link. A voltage divider is coupled between the output of the evaluation switch and the negative bus providing a divided voltage output to one of the auxiliary/thermistor A/D inputs. The battery monitoring IC transmits a digital value representative of the divided voltage output to the main microprocessor via the serial data link, and the main microprocessor determines the main battery voltage in response to the digital value.

DETAILED DESCRIPTION OF PREFERRED EMBODIMENTS

Figure 1:
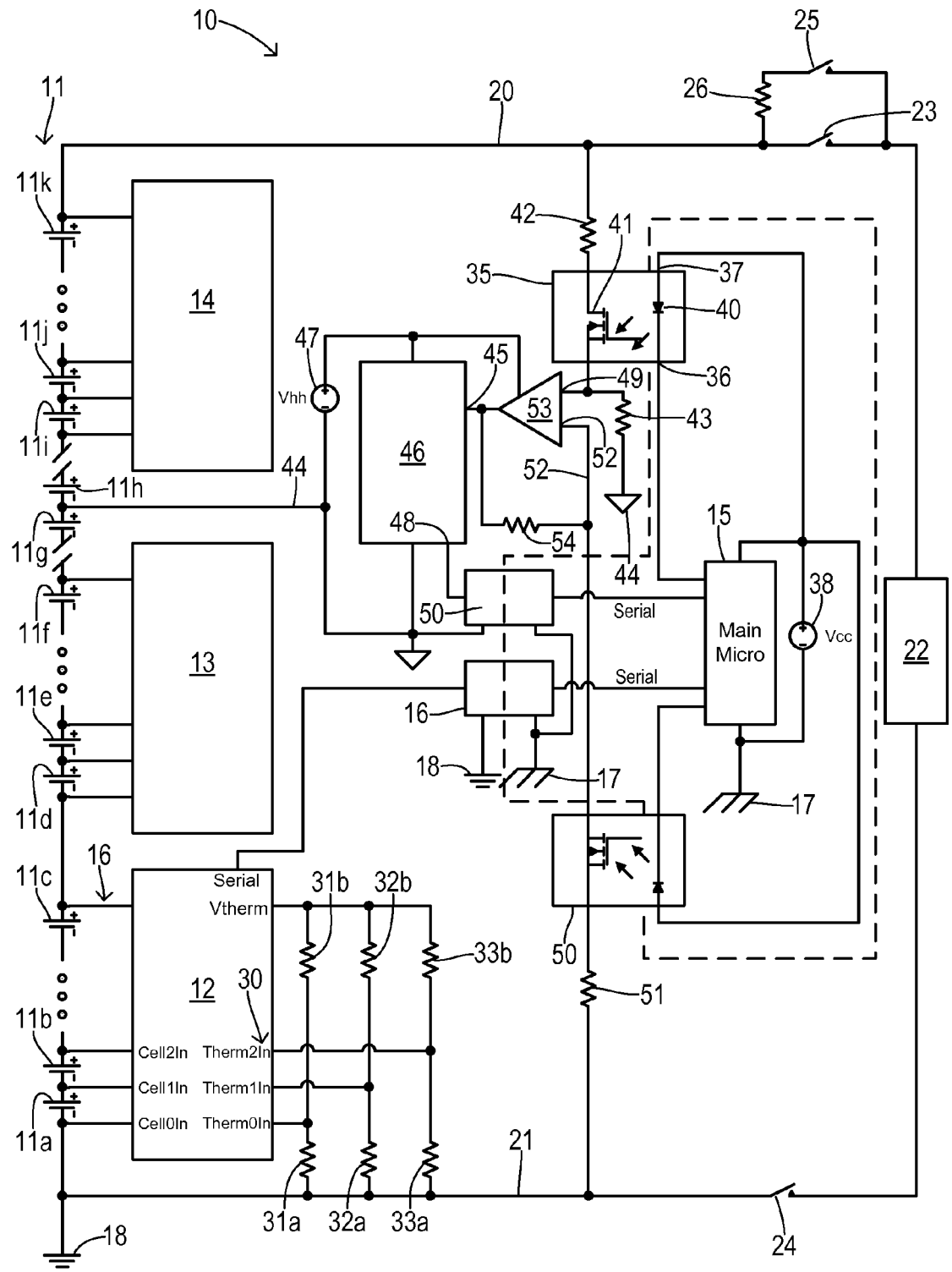
FIG. 1 is a schematic, block diagram showing one embodiment of a prior art electric drive system with monitoring of main battery voltage.

Referring now to FIG. 1, a conventional electric vehicle system 10 includes a main battery pack 11 having individual cells including a plurality of representative cells 11a-11k. A plurality of battery monitoring ICs 12, 13, and 14 are connected to respective ones of the battery cells in a stacked manner. Cell monitoring inputs 16 connect each corresponding cell to a respective input pin (e.g., Cell0In) of battery monitoring ICs 12-14. The same interconnections shown for battery monitoring IC 12 would also be present for battery monitoring ICs 13 and 14, but are not all shown in FIG. 1. A main micro processor 15 receives measured data from a serial output of IC 12 coupled through a digital isolator 16, thereby forming a serial data link capable of two-way communication between the high-voltage domain of IC 12 and the low voltage, chassis grounded domain of main micro 15. Main micro 15 is coupled to a chassis ground 17 while isolation circuit 16 is coupled to both the chassis ground 17 and a high-voltage ground 18.

The output of battery pack 11 is coupled between a positive bus 20 and a negative bus 21. Vehicle loads 22 such as a DC-to-AC inverter for driving an electric motor machine (which may be preceded by a DC-to-DC boost converter) receives DC power from busses 20 and 21 via main contactor switches 23 and 24, respectively. A precharge switch 25 and precharge resistor 26 may be coupled across positive contactor switch 23 as known in the art. Contactor switches are driven in a conventional manner as known in the art.

Battery monitoring IC 12 includes a plurality of auxiliary/thermistor A/D inputs 30 each coupled to negative bus 21 and ground 18 via respective thermistors 31a-33a. Each thermistor is coupled to a reference voltage by respective pull-up resistors 31b-33b. Thermistors 31a-33a are each mounted in proximity to a respective battery cell to act as temperature probes. Each respective thermistor voltage is converted by battery monitoring IC 12 to a corresponding digital value which is sent to main micro 15 along with the individual cell voltages over the serial data link to allow main micro 15 to monitor operation of each battery cell.

It is desired for main micro 15 to also monitor the total voltage delivered by battery pack 11 between busses 20 and 21. The total voltage is used to monitor the discharging of the battery pack, for example.

In conventional systems, dedicated circuitry has been required for measuring the total voltage between busses 20 and 21. As shown in FIG. 1, a first domain-crossing device 35 comprised of a photoMOS device with a control input 36 is coupled to receive a logic-level control signal from main micro 15. A reference input 37 receives a reference voltage $v_{cc}$ from a supply 38. Main micro 15 pulls down input 36 to a low logic level in order to activate a photodiode light source 40 in device 35 thereby turning on an output transistor 41.

A resistor 42 couples a drain of transistor 41 to positive bus 20. A source of transistor 41 is connected to one side of a resistor 43 having its other side coupled to a midpoint voltage reference 44 at a midpoint of battery pack 11. The source of transistor 41 is further connected to a noninverting input 49 of a differential amplifier 53. A high-voltage-domain auxiliary source 47 provides a supply voltage $v_{hh}$ to an analog-to-digital converter (ADC) 46 and to differential amplifier 53. An inverting input 52 of differential amplifier 53 is selectably coupled to negative bus 21 through a photoMOS device 50 and a resistor 51. The output of differential amplifier 53 is connected to a conversion input 45 of ADC 46. A feedback resistor 54 couples the output of differential amplifier 53 to input 52.

To initiate a battery pack voltage measurement, main micro 15 activates domain crossing devices 35 and 50. Noninverting input 49 receives an intermediate voltage between midpoint voltage 44 and the positive voltage from bus 20 according to a voltage divider formed by resistors 42 and 43. The output from differential amplifier 53 is proportional to the difference between i) the voltage from the positive bus via resistor 42 and ii) the negative bus voltage via resistor 51. This output is sampled by ADC 46 and the resulting digital value is output by a serial output 48 to an isolation circuit 50 for transmission back to a corresponding serial input of main micro 15. The digital value is converted to the corresponding magnitude for the battery pack voltage.

Figure 2:
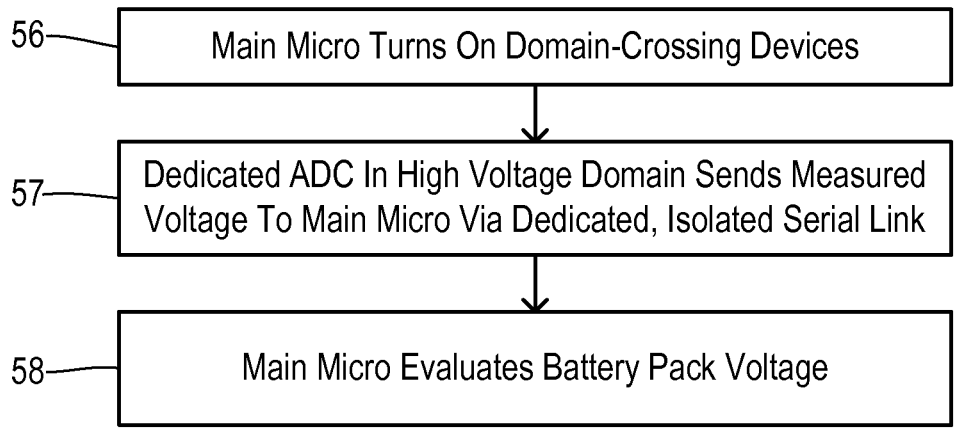
FIG. 2 is a flowchart showing a method used in the system of FIG. 1.

FIG. 2 summarizes the prior art method for measuring the battery pack voltage. In step 56, the domain crossing devices are turned on by the main micro. The dedicated analog-to-digital converter in the high-voltage domain sends the measured voltage obtained from the differential amplifier to the main micro via a dedicated, isolated serial link in step 57. In step 58, the main micro converts the voltage measurement to a battery pack voltage based on the calibration of the components in the measurement circuit.

The domain crossing switches and dedicated components (e.g., including an analog to digital convertor, digital isolation, and differential amplifier) result in significant added expense. It would be desirable to better utilize the capabilities of battery monitoring ICs to evaluate the battery pack voltage without the addition of high cost components.

Figure 3:
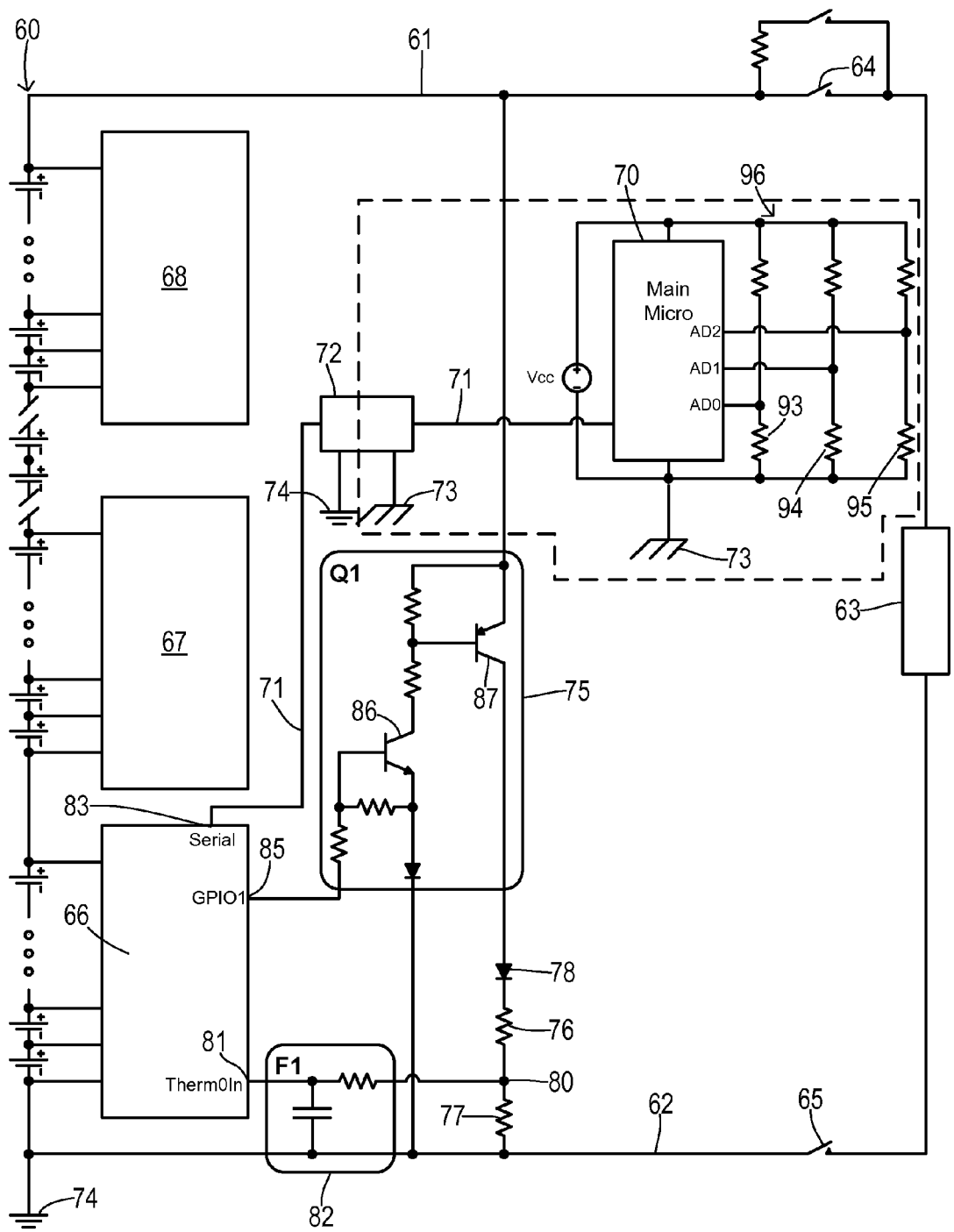
FIG. 3 is a schematic, block diagram of one embodiment of an electric drive system of the present invention with a lower cost implementation of battery pack voltage measurement.

As shown in FIG. 3, the present invention achieves the foregoing goals by repurposing of the auxiliary/thermistor A/D inputs of a battery monitoring IC from performing temperature monitoring to performing battery pack voltage measurement.

A multi-cell battery pack 60 provides a main battery voltage between positive bus 61 and negative bus 62. The electric vehicle loads 63 (e.g., boost converter and inverter) are coupled to buses 61 and 62 by a positive contactor switch 64 and by a negative contactor switch 65. A plurality of battery monitoring ICs 66-68 are connected in the same manner to individual battery cells for monitoring cell voltages and the like. At least one of the battery monitoring ICs has a serial data link with a main micro 70, such as a serial link 71 provided from serial output pin 83 of battery monitoring IC 66 to main micro 70 through a digital isolation circuit 72. As known in the art, sending a serial link (e.g., SPI=Small Peripheral Interface) across the high voltage, low voltage domain barrier can be done using a digital isolator (e. g., Analog Devices ADuM1401 quad-channel digital isolator). Main micro 70 is referenced to a chassis ground 73, while the high-voltage domain is referenced to a high-voltage ground 74. Main micro 70 is digitally isolated from buses 61 and 62 so that it can be easily connected to other control modules (not shown) throughout the vehicle.

A high-voltage evaluation switch 75 may include appropriately biased switching transistors 86 and 87 for toggling the output in response to a selectable drive signal received from an auxiliary output terminal 85 of IC 66. Terminal 85 may be a general purpose input/output pin as commonly used in the art. Many other acceptable transistor devices and drive configurations could be used for switch 75.

In order to measure the output voltage from battery pack 60, high-voltage evaluation switch 75 has an input coupled to positive bus 61 and an output coupled to negative bus 62 through a voltage divider comprised of resistors 76 and 77. A reverse voltage blocking diode 78 may be coupled between the output of switch 75 and resistor 76 to handle switching and other transients. A junction 80 between high side and low side resistors 76 and 77 provides a divided voltage output to an auxiliary/thermistor A/D input 81 of IC 66 through a filter 82 that may be optionally included for further reducing noise and transients.

When a measurement of the battery pack voltage is needed by main micro 70, it sends a corresponding command to battery monitoring IC 66 via serial link 71. In response, auxiliary output terminal 85 is driven high in order to turn on evaluation switch 75. The main battery voltage between buses 61 and 62 is coupled across diode 78 and resistors 76 and 77. A proportional voltage at junction 80 is coupled to auxiliary A/D input 81, and a corresponding digital value is transmitted to main micro 70 over serial data link 71. The digital value representative of the divided voltage output is converted by main micro 70 to an appropriate voltage value. Thus, the battery voltage is determined in the high voltage domain using only relatively inexpensive components.

By utilizing a thermistor A/D input of the battery monitoring IC to instead perform battery pack voltage measurement, the inputs are no longer available for performing temperature monitoring of at least some of the battery cells. However, thermistors used for the purpose of temperature monitoring do not need to be connected in the high voltage domain. Thus, the present invention can continue to monitor the temperature of cells connected to battery monitoring IC 66 by connecting the corresponding thermistors 93-95 to available A/D inputs of main micro 70. Resistors 96 are the pull up resistors for thermistors 93-95. Since only the auxiliary A/D inputs of battery monitoring IC 66 have been repurposed, corresponding thermistors for the cells being monitored by ICs 67 and 68 may continue to be connected to ICs 67 and 68, with the corresponding data being provided to main micro 70 over corresponding serial data links.

Figure 4:
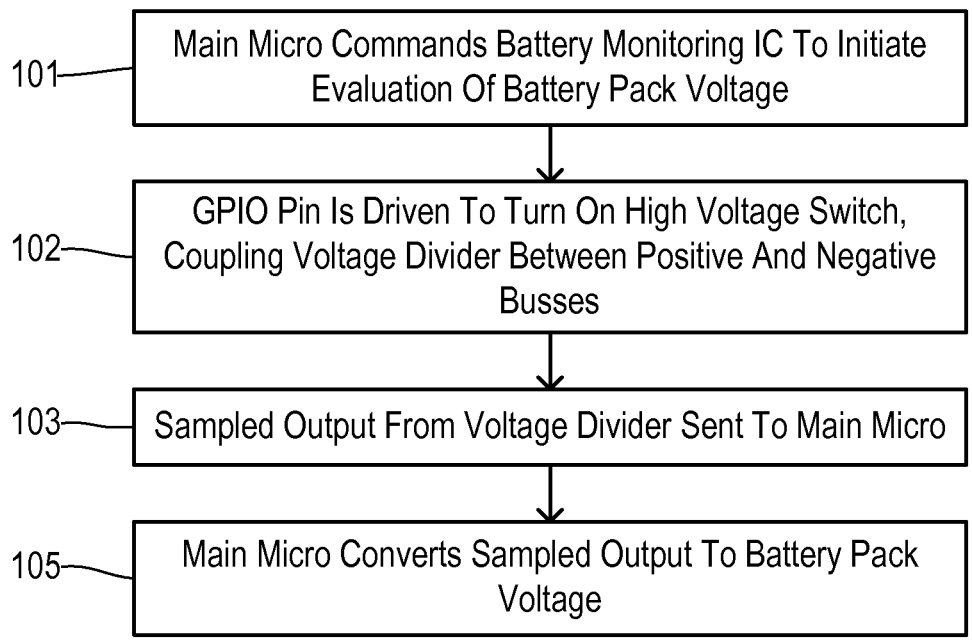
FIG. 4 is a flowchart of one preferred method of the invention.

A preferred method of the invention is shown by the flowchart in FIG. 4. At appropriate times during its operation, the main micro commands a battery monitoring IC to measure the battery pack voltage in step 101. In step 102, a general purpose input/output pin is switched to a high voltage to turn on the high voltage switch, thereby coupling the voltage divider between the positive and negative busses. A divided output voltage from the voltage divider is sampled in step 103 and sent to the main micro using the serial data link. In step 105, the main micro converts the voltage measurement to the corresponding battery pack voltage. Thus, the voltage is measured without the need for photoMOS devices or other dedicated, high cost components in the high voltage domain. Instead, the preexisting battery monitoring IC can be controlled via a serial link with the main micro which already has a mechanism for traversing between the two voltage domains.

What is claimed is:

1. An electric vehicle system, comprising:
    a multi-cell battery pack providing a main battery voltage between a positive bus and a negative bus;
    a main microcontroller monitoring performance of the battery pack, the main microcontroller being coupled to a chassis ground and being digitally isolated from the positive and negative busses;
    a battery monitoring IC connected to the battery pack to measure respective voltages of cells in the battery pack, wherein the battery monitoring IC has an isolated serial data link to the main microcontroller to report the measured voltages, and wherein the battery monitoring IC further includes a plurality of auxiliary A/D inputs and an auxiliary output terminal selectably providing a drive signal;
    an evaluation switch having an input, an output, and a control terminal, wherein the input is connected to the positive bus, and wherein the control terminal is coupled to the auxiliary output terminal so that the evaluation switch is activated in response to a command received from the main microcontroller over the serial data link; and
    a voltage divider coupled between the output of the evaluation switch and the negative bus and providing a divided voltage output to one of the auxiliary A/D inputs;
    wherein the battery monitoring IC transmits a digital value representative of the divided voltage output to the main microcontroller via the serial data link, and wherein the main microcontroller determines the main battery voltage in response to the digital value.

2. The system of claim 1 wherein the voltage divider is comprised of a high side resistor coupled in series with a low side resistor, wherein a junction between the resistors provides the divided voltage output which is coupled to the auxiliary A/D input, and wherein the system further comprises a reverse voltage blocking diode coupled between the evaluation switch and the high side resistor.

3. The system of claim 2 further comprising a filter coupled between the auxiliary A/D input and the junction between the high side and low side resistors.

4. The system of claim 1 further comprising a thermistor mounted for sensing a temperature of the battery pack and coupled to an A/D conversion input of the main microcontroller and to the chassis ground.

5. An electric-vehicle battery monitoring method comprising:
    digitally isolating a main microprocessor which is coupled to a chassis ground from a battery monitoring IC which is connected to a multi-cell battery pack to measure respective voltages of cells in the battery pack, wherein the battery monitoring IC has an isolated serial data link to the main microprocessor to report the measured voltages;
    selectably coupling a voltage divider between a positive bus and a negative bus driven by the multi-cell battery pack and to the battery monitoring IC;
    digitally sampling a divided voltage using an auxiliary input of the battery monitoring IC;
    transmitting a digital sample to the main microprocessor via the isolated serial data link; and
    evaluating the digital sample to determine an output voltage of the battery pack.

\* \* \* \* \*